(12) United States Patent
Richter et al.

(10) Patent No.: US 8,338,314 B2
(45) Date of Patent: Dec. 25, 2012

(54) TECHNIQUE FOR REDUCING TOPOGRAPHY-RELATED IRREGULARITIES DURING THE PATTERNING OF A DIELECTRIC MATERIAL IN A CONTACT LEVEL OF CLOSELY SPACED TRANSISTORS

(75) Inventors: Ralf Richter, Dresden (DE); Heike Salz, Dresden (DE); Robert Seidel, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 300 days.

(21) Appl. No.: 12/372,006

(22) Filed: Feb. 17, 2009

(65) Prior Publication Data
US 2009/0275200 A1 Nov. 5, 2009

(30) Foreign Application Priority Data
Apr. 30, 2008 (DE) .......................... 10 2008 021 555

(51) Int. Cl.
*H01L 21/31* (2006.01)
(52) U.S. Cl. ................ 438/783; 257/E21.219
(58) Field of Classification Search ................. 438/783; 257/E21.219, E21.528
See application file for complete search history.

(56) References Cited

U.S. PATENT DOCUMENTS

| | | | |
|---|---|---|---|
| 2003/0194874 A1* | 10/2003 | Ouchi | 438/710 |
| 2005/0214998 A1* | 9/2005 | Chen et al. | 438/199 |
| 2005/0269650 A1 | 12/2005 | Pidin | 257/411 |
| 2007/0108525 A1 | 5/2007 | Yang et al. | 257/351 |
| 2007/0161169 A1* | 7/2007 | Belyansky et al. | 438/197 |
| 2007/0249113 A1* | 10/2007 | Grudowski et al. | 438/199 |

FOREIGN PATENT DOCUMENTS

| | | |
|---|---|---|
| DE | 102006040765 | 3/2008 |
| DE | 102006046374 | 4/2008 |
| DE | 102006046381 | 4/2008 |

OTHER PUBLICATIONS

Anonymous, "Structure and Method of Using Oxidized Silicon Nitride as an Etch-Stop Layer for Wet Chimistry Etching of Silicon Nitride", Sep. 4, 2003, PriorArtDatabase (www.ip.com), IPCOM000019209D.*

Translation of Official Communication from German Patent Office for German Patent Application No. 10 2008 021 555.4 dated Dec. 19, 2008.

* cited by examiner

*Primary Examiner* — N Drew Richards
*Assistant Examiner* — Yu-Hsi D Sun
(74) *Attorney, Agent, or Firm* — Williams, Morgan & Amerson, P.C.

(57) ABSTRACT

In a dual stress liner approach, the surface conditions after the patterning of a first stress-inducing layer may be enhanced by appropriately designing an etch sequence for substantially completely removing an etch stop material, which may be used for the patterning of the second stress-inducing dielectric material, while, in other cases, the etch stop material may be selectively formed after the patterning of the first stress-inducing dielectric material. Hence, the dual stress liner approach may be efficiently applied to semiconductor devices of the 45 nm technology and beyond.

16 Claims, 6 Drawing Sheets

TECHNIQUE FOR REDUCING TOPOGRAPHY-RELATED IRREGULARITIES DURING THE PATTERNING OF A DIELECTRIC MATERIAL IN A CONTACT LEVEL OF CLOSELY SPACED TRANSISTORS

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch contact layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 45 nm technology and even further advanced approaches, due to the limited conformal deposition capabilities of the deposition processes involved, which may result in respective process non-uniformities during subsequent process steps for patterning the stressed layer and forming contact openings, as will be explained in more detail with reference to FIGS. 1a-1d.

FIG. 1a schematically illustrates a top view of a semiconductor device 100 comprising a first device region 120A and a second device region 120B. The first and second device regions 120A, 120B may represent device regions in which closely spaced transistor elements have to be formed, which may comprise gate electrodes 121 in the form of conductive polysilicon lines, which may extend above a semiconductor layer 102 which may, for instance, at the first device region 120A, represent the active regions for N-channel transistors, while the semiconductor layer 102 may represent a P-active region in the device region 120B. The gate electrode structures 121 may also extend above an isolation region 103, for instance, in the form of an appropriate dielectric material, such as silicon dioxide and the like, which may also be indicated as field region.

FIG. 1b schematically illustrates a cross-sectional view of the semiconductor device 100 in a certain manufacturing stage for forming stress-inducing layers above the first device area 120A and the second device area 120B. The cross-sectional view is taken along the line 1b-1b of FIG. 1a and hence the specific transistor configuration within the semiconductor layer is not illustrated, since, according to the cross-section of FIG. 1b, the gate electrodes are shown above the isolation structure 103. The first and second device areas 120A, 120B, which typically represent respective transistor elements, may be formed above a substrate 101 comprising the semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise the gate electrodes 121 formed on respective gate insulation layers (not shown), which separate the gate electrodes 121 from a corresponding channel region in the semiconductor layer 102, which is laterally located between respective drain/source regions. Furthermore, a sidewall spacer structure 122 may be formed on sidewalls of the gate electrode 121. Typically, metal silicide regions (not shown) may be provided in the drain and source regions and the gate electrodes 121 in order to enhance the conductivity of these areas. Furthermore, the isolation region or field region 103 may be recessed in the region 120B and also to a lesser degree in the region 120A, as indicated by 103B, 103A, respectively. The semiconductor device 100 may represent an advanced device, in which critical dimensions, such as the gate length, i.e., in FIG. 1b, the horizontal extension of the gate electrodes 121, may be approximately 50 nm or significantly less. Consequently, a distance between respective transistor elements, i.e., the lateral distance between neighboring sidewall spacer structures 122 of closely spaced gate electrodes 121, as shown in the device region 120B, may be approximately 150 nm or even less.

Furthermore, in the manufacturing stage shown in FIG. 1b, a silicon nitride layer 130, comprising, for instance, a high intrinsic tensile stress, is formed above the first and second device areas 120A, 120B, followed by an etch stop layer 131 comprised of silicon dioxide. It should be appreciated that, if required, an etch stop layer 133, such as a silicon dioxide layer of appropriate thickness and density, may be provided between the silicon nitride layer 130 and the respective transistor elements in the first and second device areas 120A, 120B. The etch stop layer 131 is typically provided with a thickness that is sufficient to stop an etch process in a later stage when patterning the layer 130, or to provide a pronounced endpoint detection signal. That is, a silicon nitride etch chemistry reacting with silicon dioxide results in a specific plasma ambient, which can be detected by standard detection techniques. Usually, a thickness of the etch indicator layer 131 is selected to be approximately 20 nm or more, thereby providing sufficient etch stop capabilities across the substrate in order to reliably control the respective etch process. In some approaches, the etch indicator layer 131 may act as a hard mask during the patterning of the silicon nitride layer 130.

As is evident from FIG. 1b, due to the reduced spacing between neighboring gate electrodes, and thus transistor elements above the semiconductor layer, and the recesses 103B, 103A, the silicon nitride layer 130 may have to be deposited on the basis of a pronounced aspect ratio, in particular in the second region 120B, due to the recess 103B.

Furthermore, in this manufacturing stage, the semiconductor device 100 may comprise a resist mask 104 exposing the second device area 120B, while covering the first device region 120A. In this case, it may be assumed that the intrinsic stress of the silicon nitride layer 130 may be appropriately selected so as to enhance the transistor performance in the first device area 120A, which in the present example represents an N-region.

A typical process flow for forming the semiconductor device 100 as shown in FIG. 1b may comprise the following processes. The gate electrodes 121 and the gate insulation layers may be formed and patterned on the basis of well-established process techniques, including advanced photolithography, deposition, oxidation and etch techniques.

As previously explained, in sophisticated applications, strain-inducing mechanisms may be implemented, for instance, in the form of a silicon germanium material provided in drain and source areas in a strained state, thereby also inducing a corresponding compressive strain in the adjacent channel region of P-channel transistors. Thus, in some cases, the N-region 120A may be covered by an appropriate etch mask, while the P-region 120B may obtain appropriate sidewall spacer elements after forming the gate electrode in order to determine an offset of cavities to be etched into the semiconductor layer 102 in the region 120B. During the corresponding patterning process, material of the isolation structure 103 may be removed, thereby increasingly forming the recess 103B, which may further be deepened by the etch processes, cleaning processes and the like, which may also create the recess 103A in the first device region 120A.

Thereafter, the drain and source regions may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed, followed by the deposition of the silicon nitride layer 130. During the deposition of the silicon nitride material, respective process parameters, such as composition of carrier gases and reactive gases, substrate temperature, deposition pressure and, in particular, ion bombardment during the deposition, may significantly influence the finally obtained intrinsic stress of the material as deposited with respect to the underlying materials. Thus, by selecting appropriate parameter values, a high degree of intrinsic stress, such as up to 2 Gigapascal (GPa) and even more of compressive stress or up to 1 GPa or even significantly higher of tensile stress, may be created to enhance the performance of the transistor in the first device area 120A. Due to the less pronounced conformality of the silicon nitride deposition process above a certain layer thickness and for increased aspect ratios, as may be encountered in particular above the isolation region 103 of highly scaled devices, caused by the reduced distance between the neighboring transistor elements at moderately dimensioned gate heights and the recesses 103B, 103A, as shown, the thickness of the silicon nitride material is selected so as to avoid irregularities, such as voids.

After the deposition of the silicon dioxide layer 131, the resist mask 104 may be formed on the basis of well-established photolithography techniques. Next, an appropriately designed etch process may be performed in order to remove a portion of the layers 130 and 131 from the device area 120A. During the corresponding etch process, the silicon dioxide material of the layer 131 may be removed first, followed by a selective etch process for removing the material of the silicon nitride layer 130, wherein the corresponding etch process may be controlled on the basis of the etch stop layer 133, if required.

FIG. 1c schematically illustrates the semiconductor device 100 at a further advanced manufacturing stage. As shown, a second dielectric layer 140 may be formed above the first and second device areas 120A, 120B, wherein a void 132 may be present in the second device area 120B due to the limited gap filling capability of the deposition process for forming a highly stressed silicon nitride material and the pronounced surface topography. The void 132 in the second device region 120B may result in a reduced stress transfer mechanism, as well as degraded etch uniformity, during the subsequent processing, thereby resulting in a significant yield loss. It is believed that the occurrence of the void 132 may be associated with etch residues 131A of the etch stop layer 131, caused by an incomplete removal of the layer 131 in the previously performed etch sequence.

Furthermore, at the manufacturing stage shown in FIG. 1c, a corresponding resist mask 104A is provided to protect the dielectric layer 140 in the second device region 120B during a corresponding etch process for removing the exposed portion of the layer 140 in the first device region 120A.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained.

FIG. 1d schematically illustrates the device 100 at a further advanced manufacturing stage, wherein a corresponding interlayer dielectric material 150, for instance comprised of silicon dioxide, may be formed above the dielectric layer 140 in the second device region 120B and above dielectric layer 130 in the first device region 120A. The dielectric material 150 may be formed on the basis of well-established techniques, such as sub-atmospheric deposition processes on the basis of TEOS, plasma assisted chemical vapor deposition (CVD) and the like, which may be followed by respective planarization processes, if required. Thereafter, respective contact openings may be formed, which may, in some cases, for instance in dense RAM regions, connect to the device layer at areas located between respective closely spaced transistors and which may also extend into the isolation region 103. Thus, the corresponding voids 132 may affect the corresponding process, thereby resulting in less reliable contacts or even total contact failures, which may represent a major contribution to the overall yield losses during the fabrication of devices of the 45 nm technology.

As a consequence, upon further device scaling, the respective limitation of deposition processes for dielectric materials of high intrinsic stress may require a significant reduction of the layer thickness of the stress-inducing layers to comply with increased aspect ratios encountered in advanced device geometries. However, in this case, the respective strain induced by the stressed dielectric materials may also be significantly reduced, thereby also reducing transistor performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of increased yield loss during the fabrication of highly scaled transistor elements caused by non-uniformities during the patterning of a contact structure on the basis of a dual stress liner approach, that is, by using a strain-inducing mechanism, in which stressed dielectric layers are provided in the contact level of the semiconductor device to enhance performance of the corresponding transistor elements. To this end, a technique may be provided in which the surface topography after the deposition of the first layer stack and the patterning thereof may be maintained less critically compared to conventional strategies, in that, in some illustrative aspects, the removal of an etch stop layer, i.e., a layer formed above the stress-inducing dielectric material, may be accomplished more efficiently, in particular in recessed device areas above isolation structures, while, in a subsequent phase, the topography may be de-escalated by, for instance, reducing spacer width, rounding corners of the recessed device areas and the like, so that a subsequent deposition of a further stress-inducing material may encounter a less pronounced surface topography, thereby significantly reducing the probability of creating voids during the deposition of the further dielectric material. In other illustrative aspects disclosed herein, an enhanced surface topography for the deposition of the further dielectric material after the patterning of the previously deposited dielectric material may be achieved by filling the etch stop layer in a local manner after patterning of the first dielectric layer, while at the same time substantially avoiding any negative influence of the locally provided etch stop material on other device areas. Consequently, semiconductor devices of the 45 nm technology may be formed efficiently and with well-approved strain-inducing mechanisms on the basis of dielectric materials, while maintaining yield loss caused by deposition and patterning related irregularities at a lower level.

One illustrative method disclosed herein comprises forming a layer stack above first and second conductive lines formed in a device level of a semiconductor device, wherein the layer stack comprises a first stress-inducing layer and an etch stop layer formed above the first stress-inducing layer. The method further comprises forming a mask so as to expose the second conductive lines and cover the first conductive lines and performing an etch sequence for removing an exposed portion of the layer stack and reducing surface topography in a space between adjacent two of the second conductive lines. Furthermore, the method comprises forming a second stress-inducing dielectric layer above the second conductive lines and the space of reduced topography and on a portion of the etch stop layer located above the first conductive lines. Finally, the method comprises selectively removing the second stress-inducing dielectric layer from above the first conductive lines by using the etch stop layer as an etch stop.

A further illustrative method disclosed herein comprises forming a layer stack above first and second conductive lines formed in a device level of a semiconductor device, wherein the layer stack comprises a first stress-inducing layer and an etch stop layer formed above the first stress-inducing layer. The method further comprises forming a mask so as to expose the second conductive lines and cover the first conductive lines. Moreover, an etch sequence is performed to remove the first stress-inducing layer and the etch stop layer from above the second conductive lines and to reduce a width of sidewall spacer elements formed on sidewalls of the second conductive lines. Furthermore, the method comprises forming a second stress-inducing dielectric layer above the second conductive lines and on a portion of the etch stop layer located above the first conductive lines. Finally, the method comprises selectively removing the second stress-inducing dielectric layer from above the first conductive lines by using the etch stop layer as an etch stop.

A still further illustrative method disclosed herein comprises depositing a first stress-inducing layer above a plurality of first transistors and a plurality of second transistors and forming a first portion of the first stress-inducing layer by selectively removing the first stress-inducing layer from above the plurality of second transistors. The method further comprises treating a surface portion of the first portion so as to form an etch control layer and forming a second stress-inducing layer above the plurality of first and the second transistors. Furthermore, the method comprises selectively removing the second stress-inducing layer from above the plurality of first transistors by performing a removal process and using the etch control layer for controlling the removal process.

BRIEF DESCRIPTION OF THE DRAWINGS

The disclosure may be understood by reference to the following description taken in conjunction with the accompanying drawings, in which like reference numerals identify like elements, and in which.

Figure 1A:
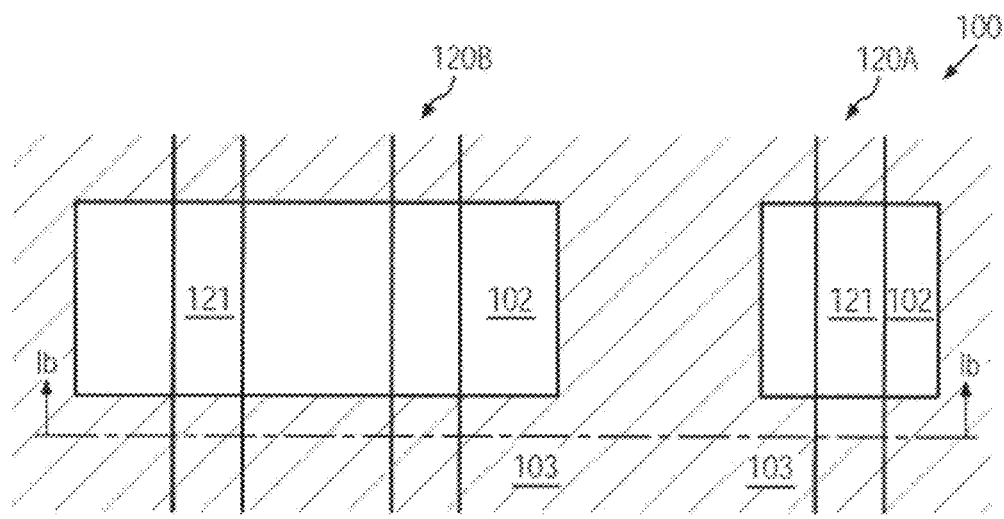
FIG. 1a schematically illustrates a top view of a semiconductor device including densely spaced transistor elements, according to a conventional circuit configuration.
Figure 1B:
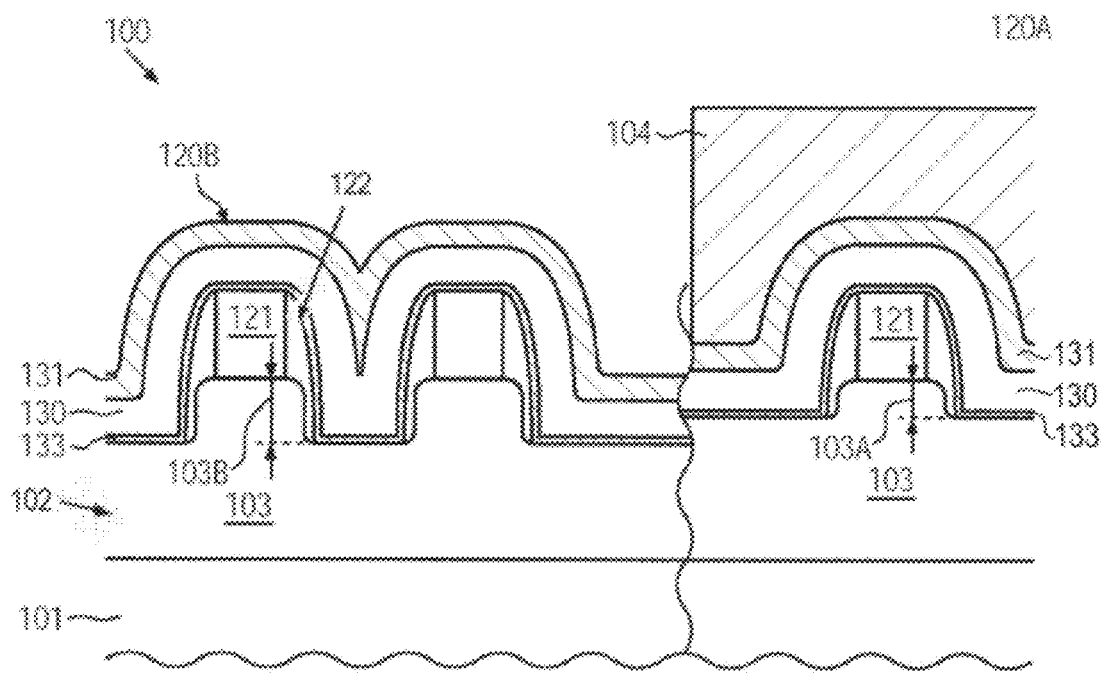
FIGS. 1b-1d schematically illustrate cross-sectional views of the semiconductor device during various manufacturing stages in forming differently stressed dielectric layers using an etch stop material between the differently stressed dielectric layers, which may result in deposition and/or patterning related irregularities, in particular in device regions of pronounced surface topography.
Figure 1C:
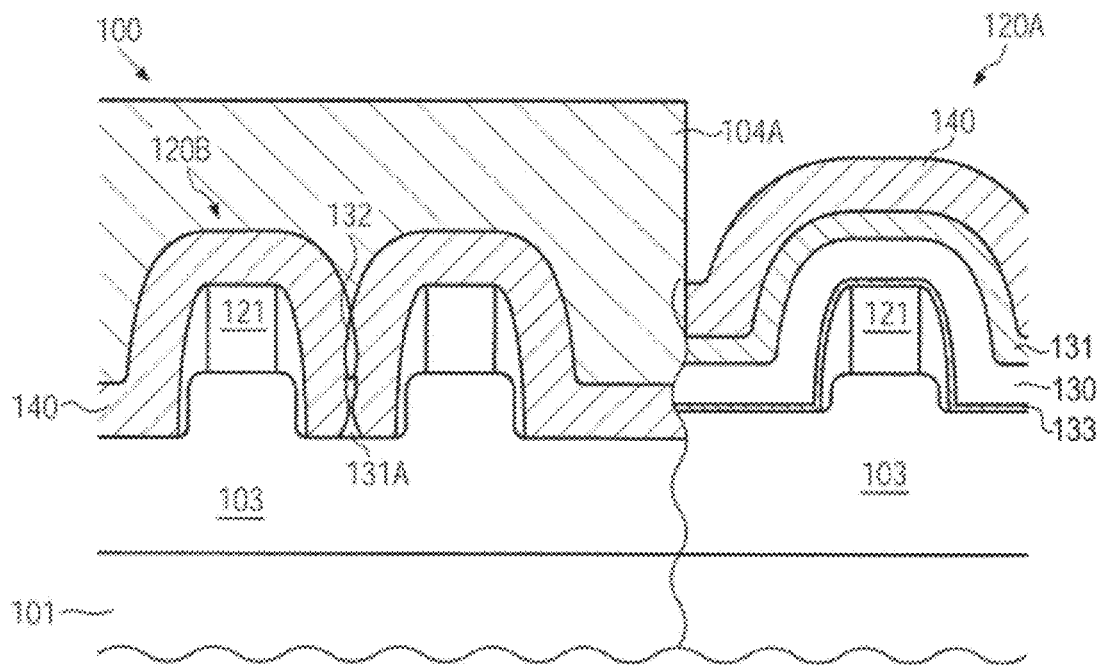
Figure 1D:
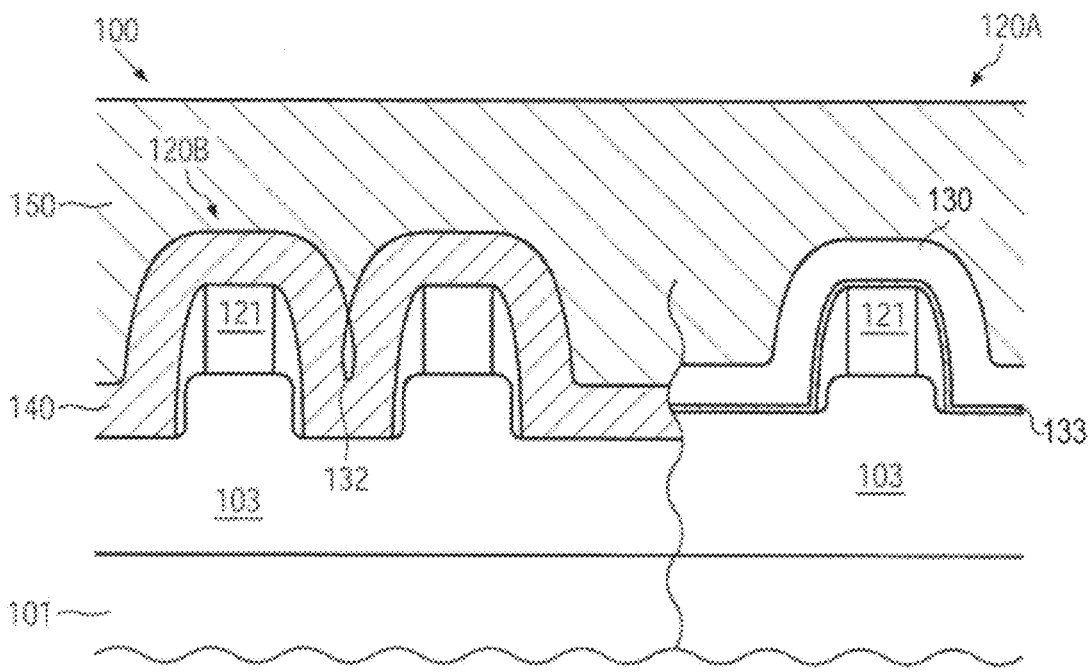

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods based on a technique for providing stressed dielectric materials above the basic transistor structures, such as a dual stress liner approach, in which, after the deposition of a first stress-inducing material, the second stress-inducing material may be deposited on the basis of less critical surface topography compared to conventional strategies by designing an etch sequence for patterning the first stress-inducing layer such that a substantially complete removal of the etch stop material may be accomplished and significant "de-escalation" of the surface topography may be accomplished prior to depositing the second dielectric layer. Consequently, respective residues of the etch stop layer may be significantly reduced compared to conventional strategies and also the general topography at recessed portions may be "smoothed" or rounded, thereby reducing the probability of creating voids during the subsequent deposition of the second stress-inducing layer. For this purpose, in some illustrative embodiments, the etch processes involved in the patterning of the dielectric layer stack comprised of the stress-inducing dielectric layer and the etch stop material may be adjusted, possibly in combination with an appropriate selection of respective layer thickness values, so that, after exposing a significant portion of the dielectric material by removing most of the etch stop layer, the subsequent "main etch" step may be interrupted by a further process for selectively removing any material of the etch stop layer, thereby obtaining a substantially complete removal thereof, even in spaces between adjacent conductive lines, which may extend across a recessed isolation region. Moreover, the etch process may be performed with a certain over-etch time, possibly with an adapted etch chemistry, so as to obtain a pronounced de-escalating effect, for instance by reducing the width of sidewall spacer elements, rounding corners of the recesses and the like.

In other illustrative embodiments disclosed herein, the patterning of the first stress-inducing layer may be enhanced by omitting the etch stop material, thereby providing enhanced surface conditions for the subsequent deposition of the second stress-inducing material. On the other hand, prior to the deposition of the second stress-inducing material, an etch stop layer may be locally formed on the remaining portion of the previously patterned dielectric material, for instance by surface treatment, such as plasma-based oxidation and the like, thereby providing a desired controllability of the subsequent removal of the second stress-inducing layer. Furthermore, since the respective etch stop layer may be locally formed on the remaining portion of the previously patterned dielectric material, the patterning thereof may be performed on the basis of an efficient etch process, thereby avoiding etch-related inefficiencies, as may be caused by oxidized etch stop layers that may be formed prior to patterning the dielectric material. Hence, since the etch stop layer is not present during the deposition and the patterning of the first dielectric material, the process sequence is less complex, as, for instance, a nitride layer only has to be taken into consideration instead of a nitride/oxide structure in conventional techniques. The surface treatment, such as the plasma-based oxidation, may, in some illustrative embodiments, be performed in the same process tool as the etch process for patterning the first dielectric layer, thereby providing a very efficient process sequence in terms of cycle time, production costs and the like. Additionally, in this case, yield loss may also be significantly reduced due to the reduction of patterning and deposition related irregularities due to the formation of the second stress-inducing dielectric material.

Figure 2A:
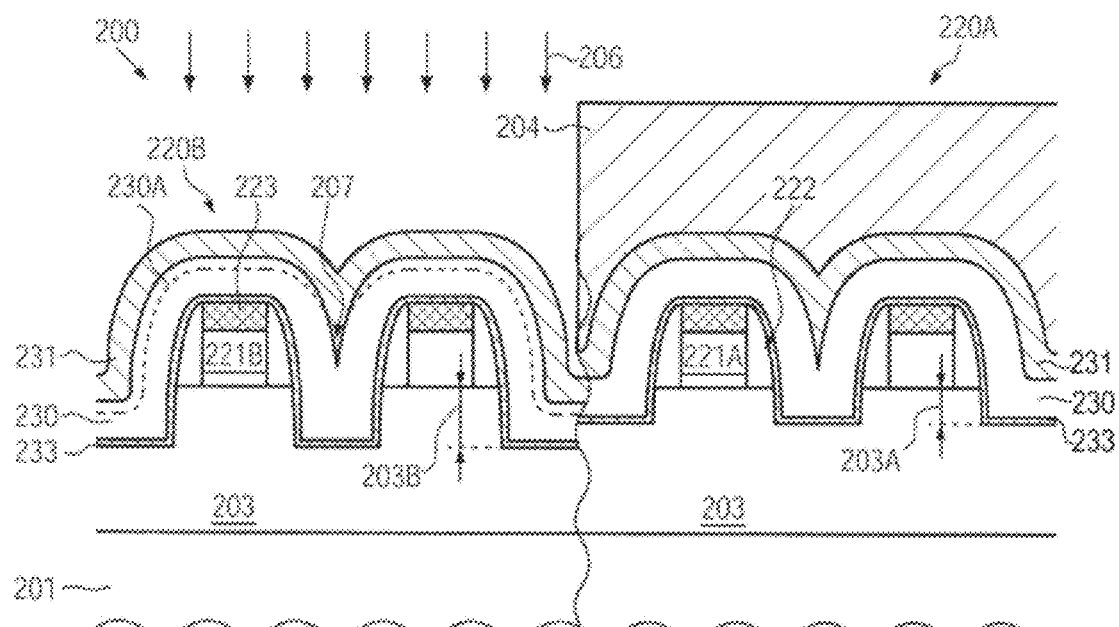
FIGS. 2a-2e schematically illustrate a semiconductor device including a plurality of closely spaced transistor elements and gate electrode structures during various manufacturing stages in forming differently stressed dielectric materials on the basis of an appropriately designed etch sequence so as to substantially completely remove an etch stop layer and de-escalate topography prior to depositing a second stressed material, according to illustrative embodiments.

FIG. 2a schematically illustrates a cross-sectional view of a semiconductor device 200, which may comprise a substrate 201, above which is formed a semiconductor layer (not shown in FIG. 2a), as is, for instance, also explained with reference to FIG. 1a when referring to the semiconductor layer 102. Furthermore, the semiconductor device 200 may comprise a first device region 220A, which may represent a semiconductor material enclosed by an isolation structure 203, which, in one illustrative embodiment, may represent an N-region, i.e., respective transistor elements may be provided in the form of N-channel transistors. Furthermore, a second device region 220B may define a corresponding portion of the semiconductor layer in combination with a respective portion of the isolation structure 203, as is also explained with reference to FIG. 1a when referring to the semiconductor device 100. For example, the second device region 220B may represent a P-region, that is, respective transistor elements may represent P-channel transistors. The first device region 220A may comprise a plurality of first conductive lines 221A, which may represent extensions of gate electrode structures of corresponding transistor elements formed in the respective semiconductor area of the region 220A. The conductive lines 221A may have a width, which may also be referred to as gate length, i.e., in FIG. 2a, the horizontal extension of the conductive lines 221A, of approximately 50 nm and less. Furthermore, in the manufacturing stage shown, depending on the device requirements, a spacer structure 222 may be formed on sidewalls of the conductive lines 221A with a width according to the overall process and device requirements. Similarly, a plurality of conductive lines 221B may be provided in the second device region 220B, wherein, also in this case, the lines 221B may represent extensions of respective gate electrodes of P-channel transistors formed in corresponding active semiconductor areas in the device region 220B.

As previously explained, the isolation region 203 corresponding to the first and the second device regions 220A, 220B may have a certain degree of recessing, depending on "the manufacturing history" of the device regions 220A, 220B. For instance, as shown, a recess 203A may be less pronounced, due to a certain degree of "asymmetry" of the manufacturing process, caused by the incorporation of a silicon/germanium material in the second region 220B, as previously explained. Moreover, the device 200 may comprise the stress-inducing layer 230, which may have a high internal stress level so as to enhance performance of transistor elements of the first device region 220A. For example, in the embodiment shown, the layer 230 may have a high internal tensile stress level. The first stress-inducing layer 230 may be provided in combination with a bottom etch stop layer 233, which may be comprised of a material having a high etch selectivity with respect to the layer 230. For example, silicon dioxide may be used in combination with silicon nitride. With respect to the characteristics of the layer 230, the same criteria apply as previously explained with reference to the layer 130. Furthermore, an etch stop layer 231, such as a silicon dioxide layer, may be formed on the first stress-inducing layer 230, wherein, in some illustrative embodiments, the thickness of the layers 231, 230, 233 is selected such that a substantially void-free deposition may be commonly accomplished. That is, depending on the deposition capabilities of the respective process techniques used, a certain degree of adaptation may be used, for instance, a certain degree of etch stop controllability may be "sacrificed" for obtaining a higher layer thickness for the material 230, if the combined thickness of the layers 230, 231 and of the layer 233 may enable a substantially void-free deposition and may also provide an appropriate surface topography so as to allow a subsequent deposition of the further material. In other cases, the thickness of the layer 230 may be selected such that a reliable substantially conformal deposition of the material 230, even for the pronounced surface topography as caused by the recess 203B, may be achieved, while the subsequent deposition of the etch stop material 231 may have a certain "smoothing" effect, thereby enhancing process conditions during a later deposition of a further stress-inducing material. Consequently, a thickness of the etch stop layer 231 may be selected such that a minimum required etch controllability may be accomplished, while a high degree of process uniformity during subsequent manufacturing steps may also be accomplished. A respective appropriate ratio of the layer thicknesses of the stack comprised of the layers 233, 230 and 231 may be established by varying at least two of the thickness values and performing one or more subsequent process steps, such as an etch sequence for removing the layers 230, 231 in order to achieve a substantially complete removal of the material of the layer 231, as explained above.

The semiconductor device 200 as shown in FIG. 2a may be formed on the basis of process techniques, as are also described above with reference to the device 100, wherein, however, in some illustrative embodiments, an appropriate adaptation of the thickness of the layers 230, 231, possibly in combination with the layer 233, may be performed, as discussed above. Thereafter, a mask 204, such as a resist mask, may be formed so as to cover the first device region 220A and to expose the second device region 220B to an etch sequence 206. In one illustrative embodiment, the etch sequence 206 may comprise a first etch step which may have none or only a moderate selectivity with respect to the materials of the layers 230, 231. For this purpose, well-established etch chemistries are available and may be used. Hence, in this case, material may be removed from both the layers 231 and 230, wherein the corresponding etch step may be controlled, for instance, by etch time and the like, so as to maintain a residual material 230, at least above most of the portions of the device region 220B. It should be appreciated that a corresponding set of process parameters may readily be established by performing test runs for determining an etch rate of the corresponding etch step 206 with respect to the materials of the layers 231, 230, in order to determine an appropriate etch time to reliably maintain the layer 230A.

In other illustrative embodiments, the etch sequence 206 may comprise a first etch step on the basis of an etch chemistry selected to etch the material of the layer 231 with a higher etch rate compared to the material of the layer 230 so that the layer 230 may act as an "etch stop" material. As previously explained, the corresponding dielectric layer stack comprised of the layers 230, 231, possibly in combination with the layer 233, may be complex in its structure, in particular in a space 207 corresponding to the recess 203B, since, in this area, the thickness of the layers 230 and/or 231 may significantly differ from the layer thickness at other device portions, such as directly above the conductive lines 221B. Consequently, performing the etch step 206 with a moderately high etch selectivity may remove most of the material of the layer 231, but may leave certain residues behind, however, in a highly non-predictable manner, while also the effect of the selective etch step on the layer 230 may result in a certain degree of non-uniformity across the substrate 201. Thus, in some illustrative embodiments, the etch sequence 206 may start with a moderately selective etch recipe so as to expose a significant portion of the layer 230 without using an undue etch time.

Figure 2B:
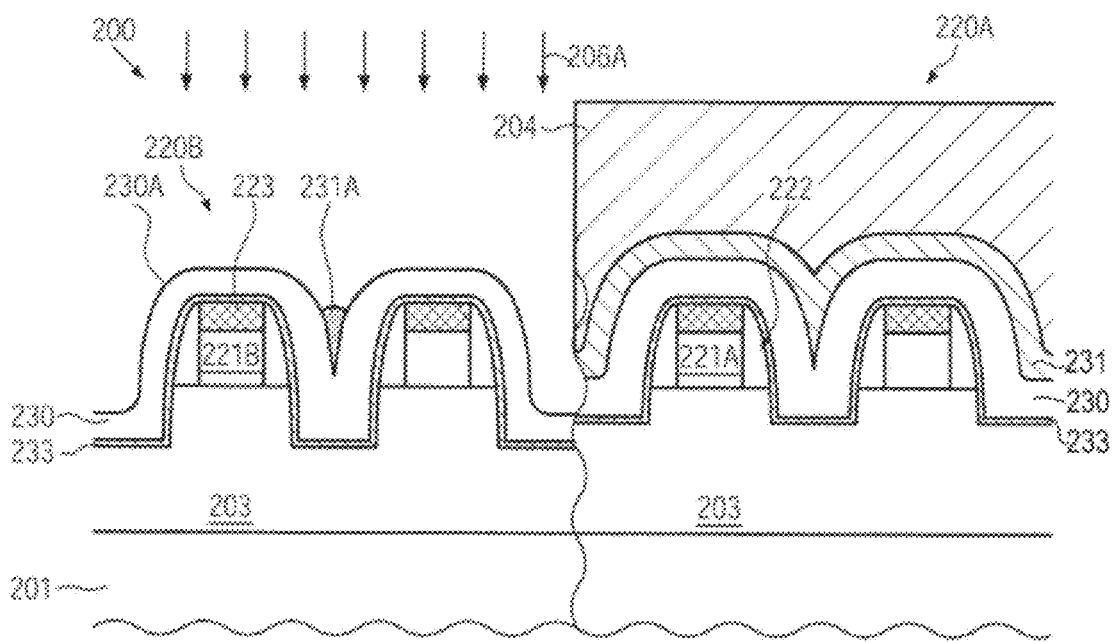

FIG. 2b schematically illustrates the semiconductor device 200 in an advanced stage of the etch sequence 206. As illustrated, the preceding etch processes of the sequence 206 may result in the residual layer 230A, which may be accomplished by a moderately selective etch step for removing significant portions of the layer 231, followed by an appropriately selected etch chemistry for efficiently removing material of the layer 230, for which well-established process recipes are available. In other cases, a single etch time-controlled process may be performed, as previously explained. Thus, in a further etch step 206A, an etch chemistry may be used which may be highly efficient in removing material of the layer 231, respective residues 231A of which may still be present, in particular in the space 207. Consequently, during the etch process 206A, the residues 231A may be efficiently removed in a substantially complete manner, as previously explained, wherein, in some illustrative embodiments, the etch process 206A may exhibit a certain degree of selectivity with respect to the layer 230A, which may therefore act as an etch stop layer or etch control layer. Consequently, undue exposure of the conductive lines 221B during the etch step 206A may be avoided.

Figure 2C:
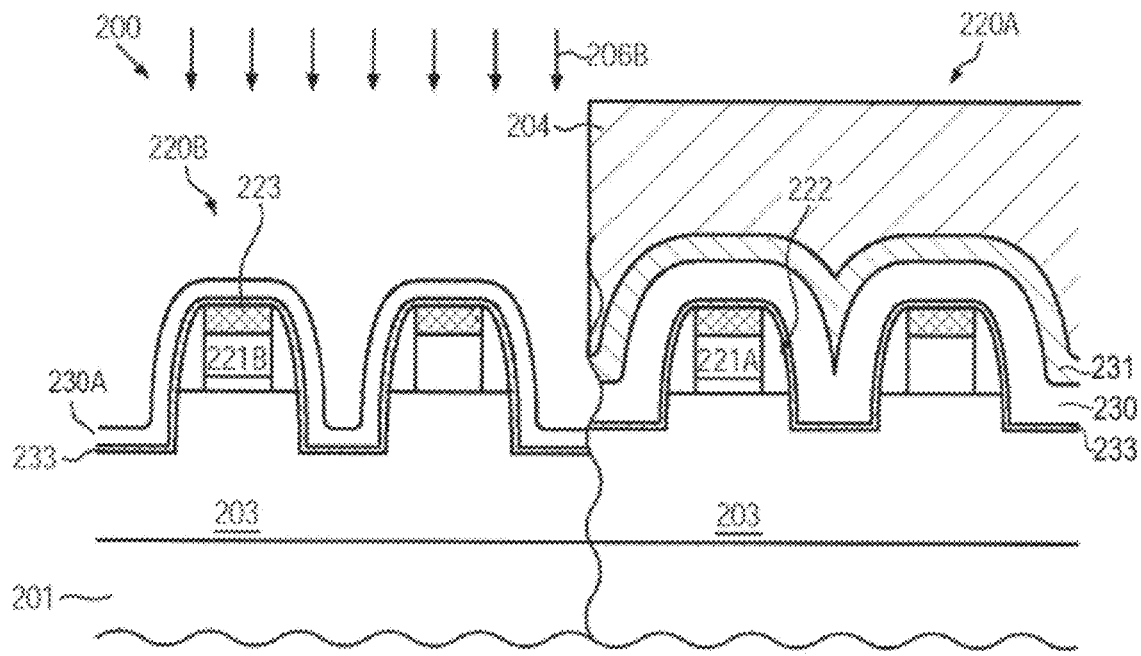

FIG. 2c schematically illustrates the device 200 in a further advanced stage of the etch sequence 206. As shown, the layer 231 may be substantially completely removed, except for minute portions, which may, however, not unduly affect the subsequent deposition of a further dielectric material. Moreover, a further etch process 206B may be performed on the basis of an appropriate etch chemistry to remove the residual layer 230A with a high degree of selectivity with respect to the bottom etch stop layer 233, if provided. In other cases, the etch step 206B may be performed selectively to the metal silicide regions 223. Thus, during the etch process 206B, the residual layer 230A may be reliably removed, and, depending on the overall process strategy, the etch stop layer 233 may also be removed or, in other cases, may be maintained, as required. Consequently, the surface topography in the second device region 220B may substantially correspond to the conditions as encountered during the deposition of the layer stack comprised of the layers 233, 230 and 231, which may therefore enable a substantially void-free deposition of a further dielectric material in a later stage.

Figure 2D:
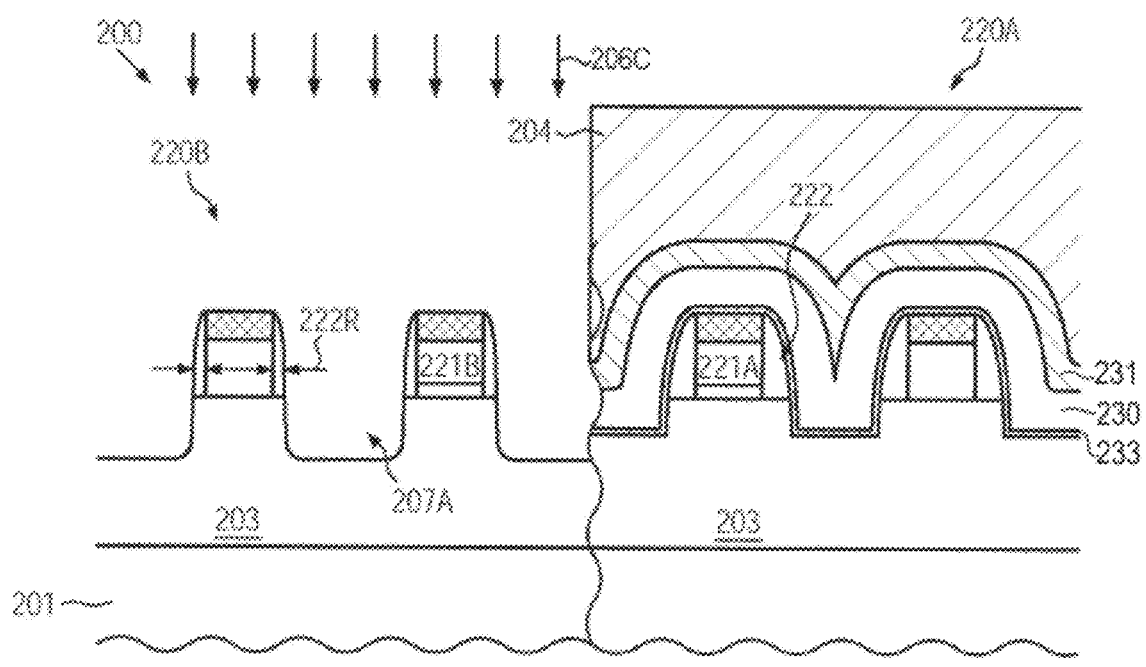

FIG. 2d schematically illustrates the device 200 in a further advanced phase 206C of the etch sequence 206. In this phase 206C, a de-escalation of the topography, in particular in the spaces 207, may be accomplished, for instance by applying a certain over-etch time to etch through the bottom etch stop layer 233, thereby attacking the sidewall spacers 222 and the exposed portion of the isolation region 203. Hence, the size and thus width of the exposed spacers 222 may be reduced, as indicated by 222R, thereby providing enhanced conditions for the subsequent deposition of a further stressed dielectric material. Furthermore, a rounding of edges and corners in the recess 203B may be achieved, thereby forming a modified space 207A having the de-escalated surface topography. It should be appreciated that the etch conditions during the phase 206C may be adapted to the desired degree of corner rounding and spacer removal, which may be accomplished by performing the sequence 206 with varying process parameters and obtaining measurement data from cross-sectional analysis techniques. For example, recipes for various oxide/nitride etch processes with different degree of selectivity between oxide and nitride are well known and may be used.

Figure 2E:
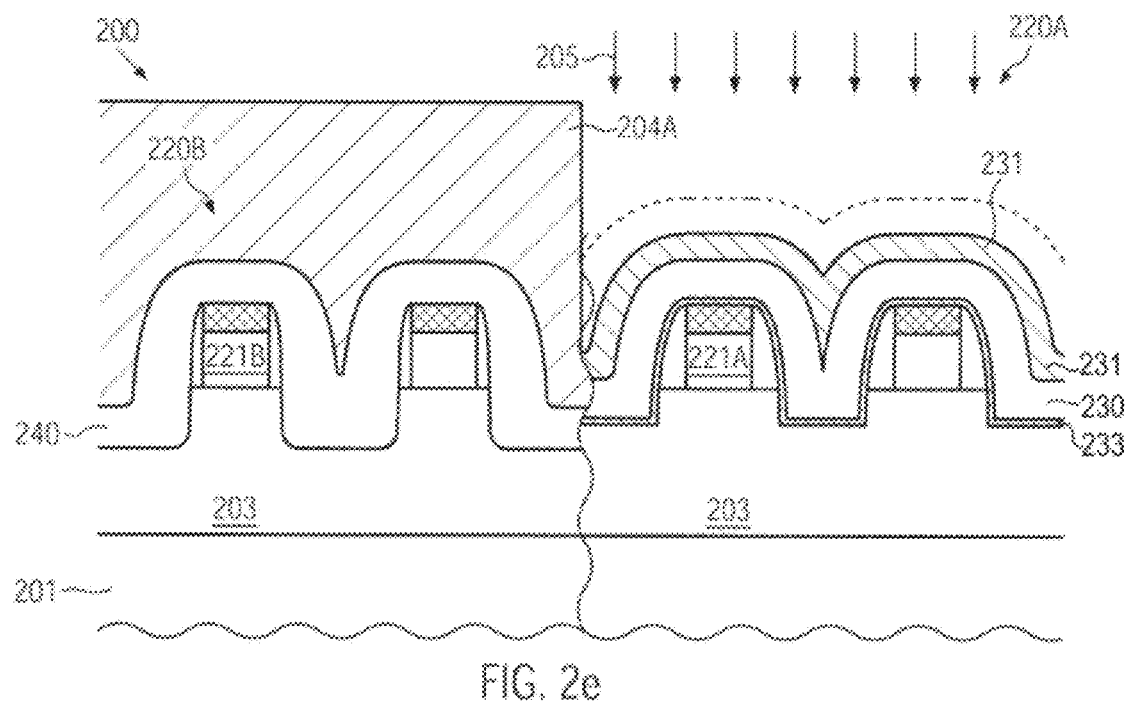

FIG. 2e schematically illustrates the device 200 in a further advanced manufacturing stage in which a second stress-inducing layer 240 may be formed in the second device region 220B in a substantially void-free manner due to the previously de-escalated surface topography during the sequence 206, in particular during the etch phase 206C. That is, the layer 240 may have an internal stress level so as to enhance performance of transistors connected to the conductive lines 221B, which may be a compressive stress level, when the device region 220B may represent a P-region, as previously discussed. Furthermore, in the manufacturing stage shown, an etch mask 204A may cover the second region 220B and may expose the first region 220A to an etch process 205 that is performed on the basis of an appropriate etch chemistry to remove material of the layer 240, as is also previously explained with reference to the device 100. During the etch process 205, the remaining etch stop layer 231 may act as an etch stop or at least as an etch control material, as also previously discussed. Thereafter, the further processing may be continued by depositing an interlayer dielectric material, for instance in the form of silicon dioxide, which may be accomplished by sub-atmospheric CVD, which may provide enhanced gap filling capabilities, thereby reliably filling the spaces 207. Next, if desired, a further plasma enhanced CVD process may be performed to provide further silicon dioxide material with high deposition rate and the required material characteristics. Consequently, upon forming respective contact openings, the significant reduction of the probability for creating voids, in particular in the region 220B, may provide enhanced yield compared to conventional strategies.

It should be appreciated that the process sequence described above may also be applied to a situation in which a compressively stressed dielectric material may be formed first, that is, the layer 230 may be comprised of a compressively stressed dielectric material, and, hence, the masking regime may be appropriately adapted so as to first cover the region 220B, while exposing the region 220A. In this case, the compressively stressed dielectric material may be removed from above the region 220A on the basis of the same process strategies, thereby providing enhanced surface conditions for the subsequent deposition of a tensile stressed dielectric material, which may thus significantly reduce the probability of creating voids in the region 220A.

Figure 2F:
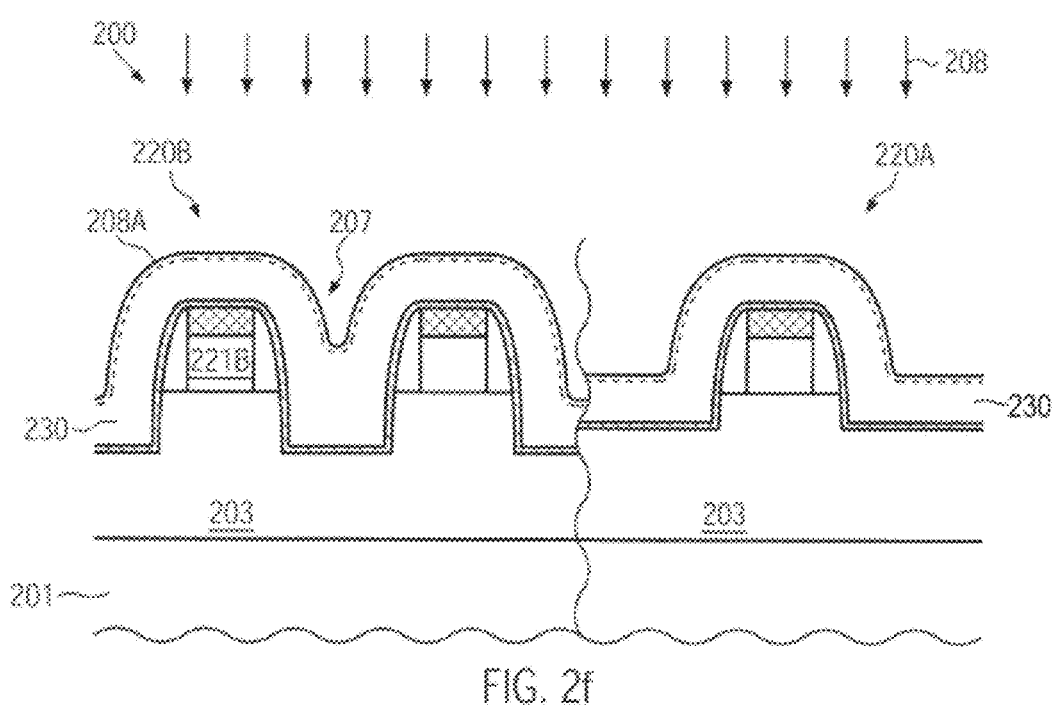
FIG. 2f schematically illustrates a cross-sectional view of the semiconductor device during a surface treatment for incorporating an etch indicator species prior to the deposition of an etch stop layer, according to still other illustrative embodiments.

FIG. 2f schematically illustrates the semiconductor device 200 according to further illustrative embodiments. As illustrated, the first stress-inducing layer 230 may be formed above the first and second device regions 220A, 220B. Furthermore, prior to the formation of the etch stop layer 231, a surface treatment 208 may be performed so as to incorporate an etch indicator species 208A into the surface of the layer 230. For this purpose, a plasma treatment may be performed in order to incorporate an appropriate species, which may generate a pronounced endpoint detection signal during the etch sequence. That is, any atomic species may be incorporated, even with very low concentration, as long as a corresponding spectrum created in the plasma ambient during the etch process may allow a reliable detection of the corresponding indicator species. In other cases, the treatment 208 may comprise an ion implantation process at an appropriately low implantation energy, thereby depositing the indicator species 208A, preferably at horizontal portions, such as directly above the conductive lines 221B and within the space 207. Thereafter, the further processing may be continued by depositing the layer 231, as previously explained, and performing the etch sequence 206 (FIGS. 2a-2d). Thus, during a corresponding etch step in the sequence 206, in which the layer 231 is to be efficiently removed or the residues 231A (FIG. 2b) are to be removed, the indicator species 208A may be used for detecting the end of the corresponding etch process. That is, the etch indicator species 208A may be released during an initial phase in the removal of material of the layer 230 so as to finally form the residual layer 230A (FIG. 2a), as previously explained. In this situation, etch indicator material may substantially no longer be released into the etch ambient. Thereafter, the residues 231A may be removed, and upon exposing the respective material of the residual layer 230A, the etch indicator species 208A may be released and thus may be detected by well-established endpoint detection techniques. Hence, a corresponding peak in the endpoint detection signal may indicate the removal of the residues 231A. Thereafter, the further processing may be continued, as previously described.

In other illustrative embodiments, the etch indicator species 208A may be applied prior to the deposition of the stress-inducing layer 230, for instance with low concentration so as to not unduly affect the characteristics of active device regions (not shown) or the metal silicide regions 223 (FIG. 2a). For this purpose, any appropriate species may be selected, such as certain metals and the like. Thus, by incorporating the species 208A into the surface portion of the isolation region 203, an appropriate endpoint of the etch phase 206C (FIG. 2d) may be determined, since, after removing a respective surface portion in the space 207, which may be exposed in a delayed manner with respect to other non-recessed surface areas, the de-escalating phase 206C in the space 207 may be controlled on the basis of a pronounced reduction of the corresponding endpoint detection signal. Hence, overall controllability of the etch sequence 206 may be enhanced.

Figure 3A:
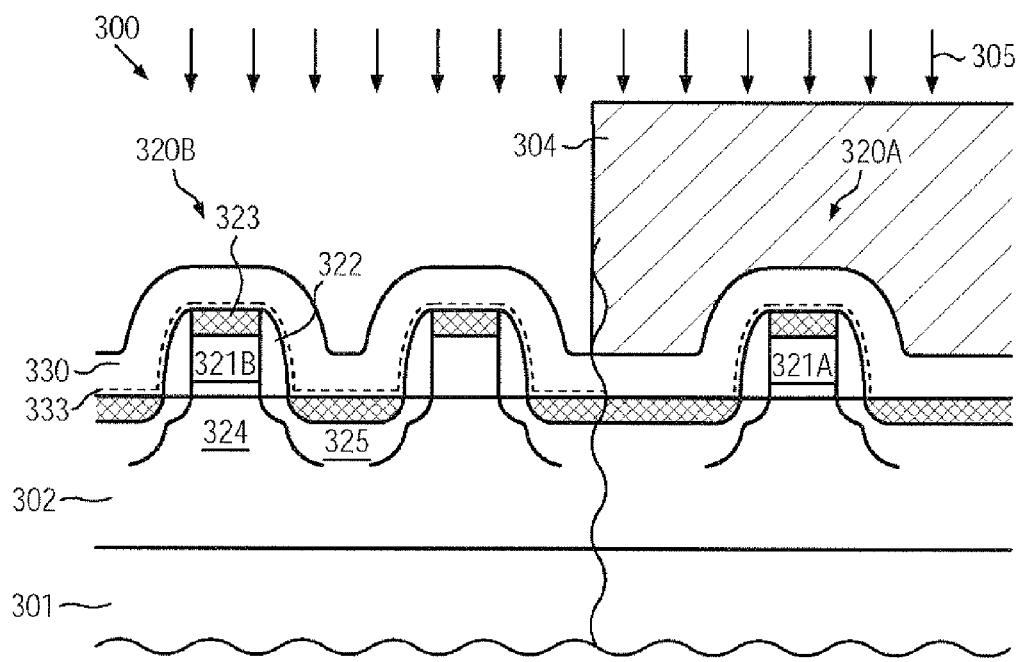
FIGS. 3a-3b schematically illustrate cross-sectional views of a semiconductor device during various manufacturing stages, wherein an etch stop layer may be formed on a patterned portion of a stress-inducing dielectric material, for instance, by plasma oxidation, to enhance the surface topography for a subsequent deposition of a further stress-inducing dielectric material, according to still other illustrative embodiments.
Figure 3B:
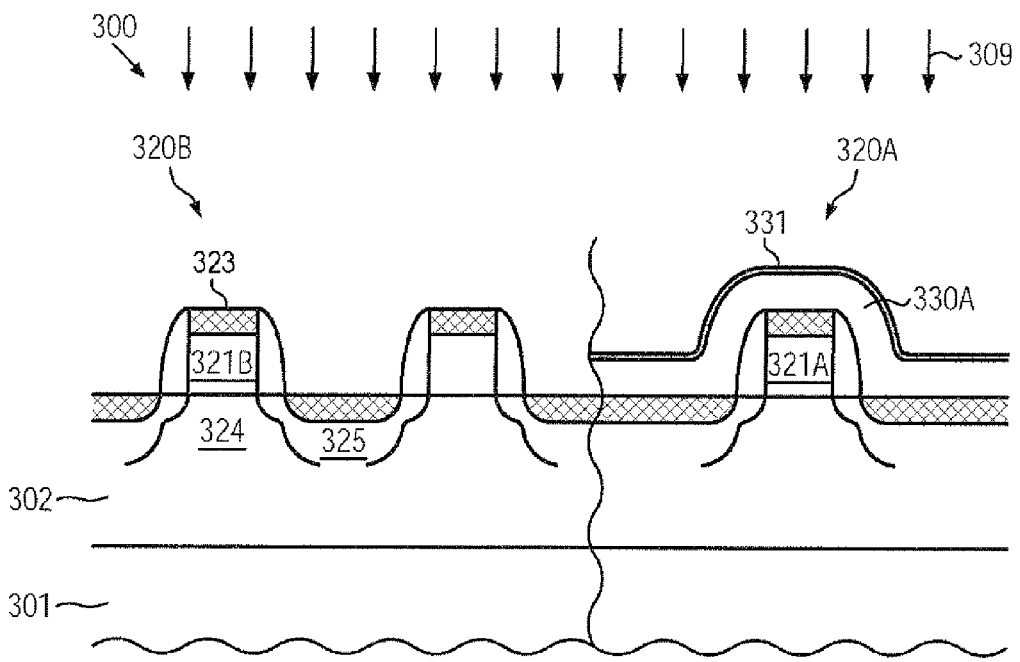

With reference to FIGS. 3a-3b, further illustrative embodiments will now be described in which an etch stop layer may be formed in a local manner, after the patterning of the first stress-inducing material.

FIG. 3a schematically illustrates a cross-section of a semiconductor device 300, comprising a substrate 301, above which is formed a semiconductor layer 302. The semiconductor layer 302 may have any appropriate configuration for forming therein and thereabove respective transistor elements, as previously explained. It should be appreciated that, in the cross-sectional view shown in FIG. 3a, respective isolation regions are not shown, for convenience, wherein it should be appreciated, however, that the configuration of the device 300 may be the same as previously explained with reference to the devices 200 and 100. Furthermore, the device 300 may comprise a first device region 320A and a second device region 320B, which may comprise transistor elements, which, for convenience, may also be referred to as first transistors 320A and second transistors 320B. It should be appreciated, however, that respective gate electrodes 321A, 321B may also extend into a corresponding isolation region, as previously explained with reference to the devices 100, 200. Moreover, in the semiconductor layer 302, respective drain and source regions 325 may be formed and may enclose a channel region 324 in accordance with a typical transistor configuration. Furthermore, metal silicide regions 323 and a spacer structure 322 may be provided.

With respect to any process techniques for forming the device 300, it may be referred to the corresponding explanations given for the devices 100 and 200. In the manufacturing stage shown, a first stress-inducing layer 330 may be formed above the gate electrodes 321A, 321B, wherein, in some illustrative embodiments, the layer 330 may be directly formed on the corresponding metal silicide regions 323, while, in other cases, a bottom etch stop layer 333 may be provided, as indicated by the dashed line. The stress-inducing layer 330 may be formed in accordance with process techniques as previously described. After the deposition of the layer 330, an etch mask 304 may be formed so as to cover the first device region 320A while exposing the second device region or transistors 320B. Furthermore, an etch process 305 may be performed in order to selectively remove the exposed portion of the layer 330, possibly by using the etch stop layer 333, if provided.

FIG. 3b schematically, illustrates the semiconductor device 300 after the etch process 305 and the removal of the etch mask 304. As shown, in some illustrative embodiments, the etch stop layer 333 may also have been removed, while, in other cases, the etch process 305 may have been controlled by using a high degree of etch selectivity with respect to the metal silicide regions 323. Furthermore, the device 300 is subjected to a surface treatment process 309 so as to locally form an etch stop layer 331 in the remaining portion 330A. In one illustrative embodiment, the treatment 309 may include an oxidation process performed in a plasma ambient which may be established on the basis of appropriate process conditions, such as the flow rate of oxygen and other carrier gases, in order to obtain a desired process pressure in the respective plasma ambient, which may range from several hundred mTorr to several Torr, depending on the overall process strategy. Appropriate process parameters for determining a desired oxidation rate for the specified material, such as silicon nitride, may be obtained by experiment, wherein at least one process parameter for establishing the plasma ambient may be varied and a corresponding process result may be monitored. Similarly, the material characteristics of a surface portion that may be in contact with the plasma assisted ambient may be determined, for instance in view of etch resistance, by creating material samples for various process conditions and determining a respective etch rate with respect to an etch recipe that may be useful for patterning a stress dielectric material to be formed in a later stage. Furthermore, in some illustrative embodiments, the overall process temperature during the treatment 309 may be maintained in a temperature range that may be compatible with the material characteristics of the device 300 in the manufacturing stage as shown in FIG. 3a. That is, in some illustrative embodiments, the treatment 309, for instance in the form of an oxidizing plasma ambient, may be established with temperatures of approximately 400° C. and less, thereby providing a reduced modification of the metal silicide regions 323. Furthermore, during the plasma-based treatment 309, appropriate values for the ion energy may be selected, i.e., a moderately reduced bias power may be used, to efficiently suppress any material deposition on exposed portions of the second device region 320B, in particular on the exposed metal silicide regions 323. Appropriate process parameters for adjusting the plasma power and the bias power may be obtained by experiment, using different plasma settings and monitoring the overall deposition rate on exposed metal silicide areas. For example, an oxygen-based plasma ambient as may similarly be used for resist strip applications may be appropriately modified, for instance, with respect to ion energy, so as to obtain the desired oxidizing effect for forming the layer 331, while substantially reducing a significant effect on the exposed region 320B. Hence, the layer 331 may be formed with an appropriate thickness as is required for the etch stop or etch control capabilities required for the subsequent patterning of a second stress-inducing material to be formed above the second device region 320B and which may have to be removed from the first device region 320A on the basis of the layer 331, as is also previously explained. In some illustrative embodiments, the thickness of the layer 331 may be selected to be approximately 10 nm and less, such as 5 nm and less, thereby avoiding undue "consumption" of material of the portion 330A.

Thereafter, the further processing may be continued, by depositing further stress-inducing material and patterning the same, as also described with reference to the devices 100 and 200, while, however, the layer 331 may be used as an efficient etch stop or etch control material. Consequently, the creation of voids may also be efficiently suppressed, since the patterning process 305 may be performed without the presence of an etch stop material, thereby providing superior surface conditions prior to the deposition of a further stress-inducing material. Furthermore, since the etch stop material may be omitted after the deposition of the layer 330, the layer 330 may be provided with an increased layer thickness, thereby compensating for or even overcompensating for a corresponding loss of stress-inducing material during the treatment 309.

As a result, the present disclosure provides methods for efficiently using a dual stress liner approach by enhancing the surface conditions for the subsequent deposition of a second stress-inducing material after the patterning of a previously deposited stress-inducing dielectric material. Thus, the probability of creating voids upon the deposition of the second stress-inducing material may be significantly reduced, which may, in conventional strategies, represent a significant contribution to overall yield loss, in particular when semiconductor devices of the 45 nm technology are considered.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
  forming a layer stack above first and second conductive lines formed in a device level of a semiconductor device, wherein forming said layer stack comprises forming a first stress-inducing dielectric layer above said first and second conductive lines, performing a surface treatment to introduce an etch indicator species into a surface portion of said first stress-inducing dielectric layer, and thereafter forming an etch stop layer above said first stress-inducing dielectric layer;
  forming a mask so as to expose said second conductive lines and cover said first conductive lines;
  performing an etch sequence adapted for removing an exposed portion of said layer stack from above said second conductive lines, wherein performing said etch sequence comprises:
    performing a first etch process to remove a first portion of said etch stop layer and a first thickness portion of said first stress-inducing dielectric layer;
    performing a second etch process to substantially completely remove a remaining portion of said etch stop layer and to remove a second thickness portion of said first stress-inducing dielectric layer; and
    performing a third etch process to substantially completely remove a remaining thickness portion of said first stress-inducing dielectric layer;
  forming a second stress-inducing dielectric layer above said second conductive lines and on a portion of said etch stop layer located above said first conductive lines; and
  selectively removing said second stress-inducing dielectric layer from above said first conductive lines.

2. The method of claim 1, wherein said first and second conductive lines have a line width of approximately 50 nm or less.

3. The method of claim 1, further comprising forming a bottom etch stop layer as a first layer of said layer stack prior to forming said first stress-inducing dielectric layer.

4. The method of claim 1, further comprising reducing a width of sidewall spacer elements formed on sidewalls of said second conductive lines during at least one etch process of said etch sequence, wherein reducing said width comprises removing a first thickness portion of said sidewall spacer elements while leaving a second thickness portion of said sidewall spacer elements adjacent said sidewalls.

5. The method of claim 4, wherein performing said first etch process comprises performing said first etch process on the basis of a selective etch chemistry that has a higher etch rate for said etch stop layer as compared to an etch rate for said first stress-inducing dielectric layer.

6. The method of claim 1, further comprising controlling at least one etch process of said etch sequence on the basis of said etch indicator species.

7. The method of claim 1, wherein performing said etch sequence comprises rounding corners of a recess formed between said adjacent two of said second conductive lines.

8. The method of claim 1, wherein said first stress-inducing dielectric layer is formed with an internal tensile stress level and said second stress-inducing layer is formed with an internal compressive stress level.

9. A method, comprising:
depositing a first stress-inducing layer above a plurality of first transistors and a plurality of second transistors;
forming a first portion of said first stress-inducing layer by selectively removing said first stress-inducing layer from above said plurality of second transistors, wherein selectively removing said first stress-inducing layer from above said plurality of second transistors comprises:
performing a first etch process to remove a first portion of an etch stop layer formed above said first stress-inducing layer and a first thickness portion of said first stress-inducing layer;
performing a second etch process to substantially completely remove a remaining portion of said etch stop layer and to remove a second thickness portion of said first stress-inducing layer; and
performing a third etch process to substantially completely remove a remaining thickness portion of said first stress-inducing layer;
treating a surface portion of at least said first portion of said first stress-inducing layer by incorporating an etch indicator species therein so as to form an etch control layer;
forming a second stress-inducing layer above said plurality of first and second transistors; and
selectively removing said second stress-inducing layer from above said plurality of first transistors by performing a removal process and using said etch control layer for controlling said removal process.

10. The method of claim 9, wherein treating said surface portion of the first stress-inducing layer is performed in an oxidizing plasma ambient.

11. The method of claim 10, wherein said plasma ambient is established at a process temperature of approximately 400° C. or less.

12. The method of claim 9, wherein said etch control layer is formed so as to have a thickness of less than approximately 10 nm.

13. The method of claim 9, wherein said first stress-inducing layer has an internal tensile stress level.

14. The method of claim 9, wherein said first stress-inducing layer has an internal compressive stress level.

15. The method of claim 9, wherein a gate length of said plurality of first and second transistors is approximately 50 nm or less.

16. The method of claim 1, wherein selectively removing said second stress-inducing layer from above said first conductive lines comprises by at least one of using said etch stop layer as an etch stop and using said etch indicator species in said surface portion of said first stress-inducing dielectric layer as an etch control layer.

* * * * *